United States Patent
Jung et al.

(10) Patent No.: US 7,873,935 B2
(45) Date of Patent: Jan. 18, 2011

(54) METHOD OF MANUFACTURING A MASK

(75) Inventors: Sung-gon Jung, Seoul (KR); Ji-young Lee, Yongin-si (KR); Han-ku Cho, Seongnam-si (KR); Gi-sung Yeo, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 813 days.

(21) Appl. No.: 11/762,838

(22) Filed: Jun. 14, 2007

(65) Prior Publication Data

US 2008/0010628 A1     Jan. 10, 2008

(30) Foreign Application Priority Data

Jul. 10, 2006    (KR)  ............... 10-2006-0064442

(51) Int. Cl.
*G06F 17/50* (2006.01)
*G06F 19/00* (2006.01)
*G21K 5/00* (2006.01)

(52) U.S. Cl. .................. 716/19; 716/21; 700/120; 700/121; 378/34; 378/35

(58) Field of Classification Search .................. 716/19, 716/21; 700/120–121; 378/34–35
See application file for complete search history.

(56) References Cited

U.S. PATENT DOCUMENTS

| 6,928,636 | B2 | 8/2005 | Ohnuma |
| 2003/0177467 | A1 | 9/2003 | Ohnuma et al. |

(Continued)

FOREIGN PATENT DOCUMENTS

JP    2003-167323    6/2003

(Continued)

OTHER PUBLICATIONS

Erdmann et al.; "Rigorous Electromagnetic Field Simulation of Two-Beam Interference Exposures for the Exploration of Double Patterning and Double Exposure Scenarios"; Mar. 12, 2008; SPIE, vol. 6924; pp. 1-12.*

(Continued)

*Primary Examiner*—Sun J Lin
*Assistant Examiner*—Suresh Memula
(74) *Attorney, Agent, or Firm*—F. Chau & Associates, LLC

(57) ABSTRACT

A method of manufacturing a mask includes designing a first mask data pattern, designing a second mask data pattern for forming the first mask data pattern, acquiring a first emulation pattern, which is predicted from the second mask data pattern, using layout-based Self-Aligning Double Patterning (SADP) emulation, comparing the first emulation pattern with the first mask data pattern, and modifying the second mask data pattern according to results of the comparison. The method further includes performing Optical Proximity Correction (OPC) on the modified second mask data pattern, acquiring second emulation patterns, which are predicted from the second mask data pattern on which the OPC has been performed, using image-based SADP emulation, and comparing the second emulation patterns and the first mask data pattern and manufacturing a first mask layer, which corresponds to the second mask data pattern on which the OPC has been performed, according to the results of the comparison.

20 Claims, 16 Drawing Sheets

U.S. PATENT DOCUMENTS

| | | | |
|---|---|---|---|
| 2006/0070018 A1* | 3/2006 | Semmler | 716/21 |
| 2006/0236294 A1* | 10/2006 | Saidin et al. | 716/19 |
| 2007/0087571 A1* | 4/2007 | Chang et al. | 438/706 |
| 2007/0220476 A1* | 9/2007 | Mukherjee et al. | 716/18 |
| 2007/0226674 A1* | 9/2007 | Haffner et al. | 716/19 |
| 2007/0275309 A1* | 11/2007 | Liu | 430/5 |
| 2008/0057610 A1* | 3/2008 | Lee et al. | 438/52 |
| 2008/0227295 A1* | 9/2008 | Chen | 438/691 |

FOREIGN PATENT DOCUMENTS

| | | |
|---|---|---|
| JP | 2005-039151 | 2/2005 |
| JP | 2005-181612 | 7/2005 |

OTHER PUBLICATIONS

Stine et al.; "A Simulation Methodology for Assessing the Impact of Spatial/Pattern Interconnect Parameter Variation on Circuit Performance"; Dec. 1997; MIT, Department of Electrical Engineering and Computer Science; pp. 1-4.*

* cited by examiner

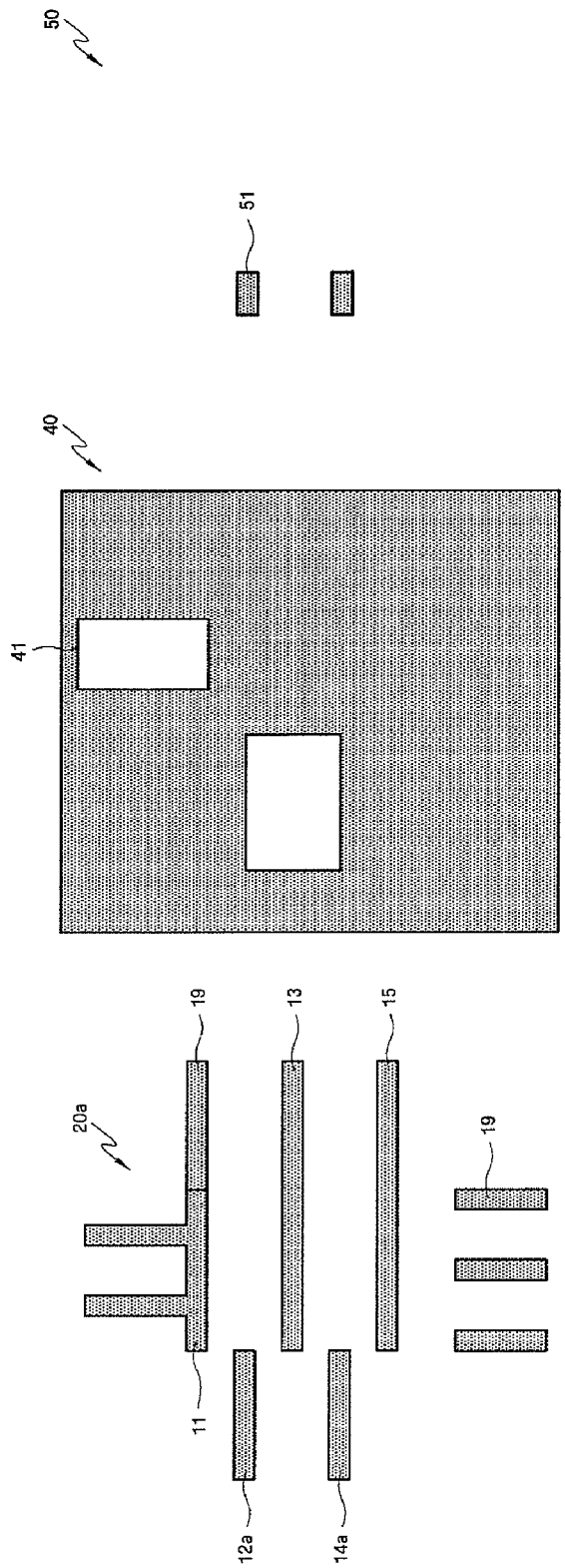

US 7,873,935 B2

METHOD OF MANUFACTURING A MASK

CROSS-REFERENCE TO RELATED APPLICATION

This application claims priority from Korean Patent Application No. 10-2006-0064442 filed on Jul. 10, 2006, the disclosure of which is hereby incorporated by reference herein in its entirety.

BACKGROUND OF THE INVENTION

1. Technical Field

The present disclosure relates to a method of manufacturing a mask and, more particularly, to a method of manufacturing a mask for forming a pattern on a wafer using a self-aligning double patterning process.

2. Description of the Related Art

The speed of the reduction of a design rule has increased at a faster pace than the speed of the development of exposure equipment. Accordingly, research into methods for realizing a pitch less than the minimum pitch that can be realized using exposure equipment is currently being conducted. Of the methods, the most representative is a Self-Aligning Double Patterning (SADP) process.

A description of the SADP process is given below. First, a mask data pattern is designed using a first pitch which can be realized using exposure equipment, and a first hard mask layer pattern is formed on a wafer using a mask layer that corresponds to the mask data pattern. Thereafter, a sacrificial layer and a second hard mask layer are formed on the first hard mask layer pattern, and a hard mask layer pattern having a second pitch less than the first pitch is formed using a planarization process and an anisotropic etching process. Using the above-described method, a pitch, which is less than the minimum pitch that can be realized using exposure equipment, is realized, so that fine patterns that help realize high integration can be formed.

SUMMARY OF THE INVENTION

In accordance with an exemplary embodiment of present invention, a method of manufacturing a mask is provided. The method including designing a first mask data pattern; designing a second mask data pattern for forming the first mask data pattern, acquiring a first emulation pattern, which is predicted from the second mask data pattern, using layout-based Self-Aligning Double Patterning (SADP) emulation, comparing the first emulation pattern with the first mask data pattern, and modifying the second mask data pattern according to results of the comparison; performing Optical Proximity Correction (OPC) on the modified second mask data pattern, acquiring second emulation patterns, which are predicted from the second mask data pattern on which the OPC has been performed, using image-based SADP emulation and comparing the second emulation patterns and the first mask data pattern, and manufacturing a first mask layer, which corresponds to the second mask data pattern on which the OPC has been performed, according to the results of the comparison.

In accordance with an exemplary embodiment of present invention, a method of manufacturing a mask is provided. The method including designing a first mask data pattern; designing a second mask data pattern for forming the first mask data pattern; acquiring a first emulation pattern, which is predicted from the second mask data pattern, using layout-based Self-Aligning Double Patterning (SADP) emulation; comparing the first emulation pattern with the first mask data pattern, and designing third mask data patterns for forming partial patterns, which were not formed using the second mask data pattern, according to results of the comparison; performing Optical Proximity Correction (OPC) on the second and third mask data patterns; acquiring second emulation patterns, which are predicted from the second and third mask data patterns on which the OPC has been performed, using image based SADP emulation; and comparing the second emulation patterns with the first mask data pattern, and manufacturing first and second mask layers, which respectively correspond to the second and third mask data patterns on which the OPC has been performed, according to the results of the comparison.

In accordance with another exemplary embodiment of present invention, a method of manufacturing a mask is provided. The method including designing a first mask data pattern to be formed on a wafer; designing a second mask data pattern for forming the first mask data pattern using an Self-Aligning Double-Patterning (SADP) process; examining whether the first mask data pattern is normally formed using the second mask data pattern; and forming third mask data patterns for forming partial patterns, which were not formed using the second mask data pattern, according to results of the examination.

BRIEF DESCRIPTION OF THE DRAWINGS

Exemplary embodiments of the present invention can be understood in more detail from the following detailed description taken in conjunction with the accompanying drawings, in which:

FIGS. 2A to 2H are diagrams illustrating the method of manufacturing a mask according to an exemplary embodiment of the present invention;

DESCRIPTION OF THE EXEMPLARY EMBODIMENTS

Figure 1:
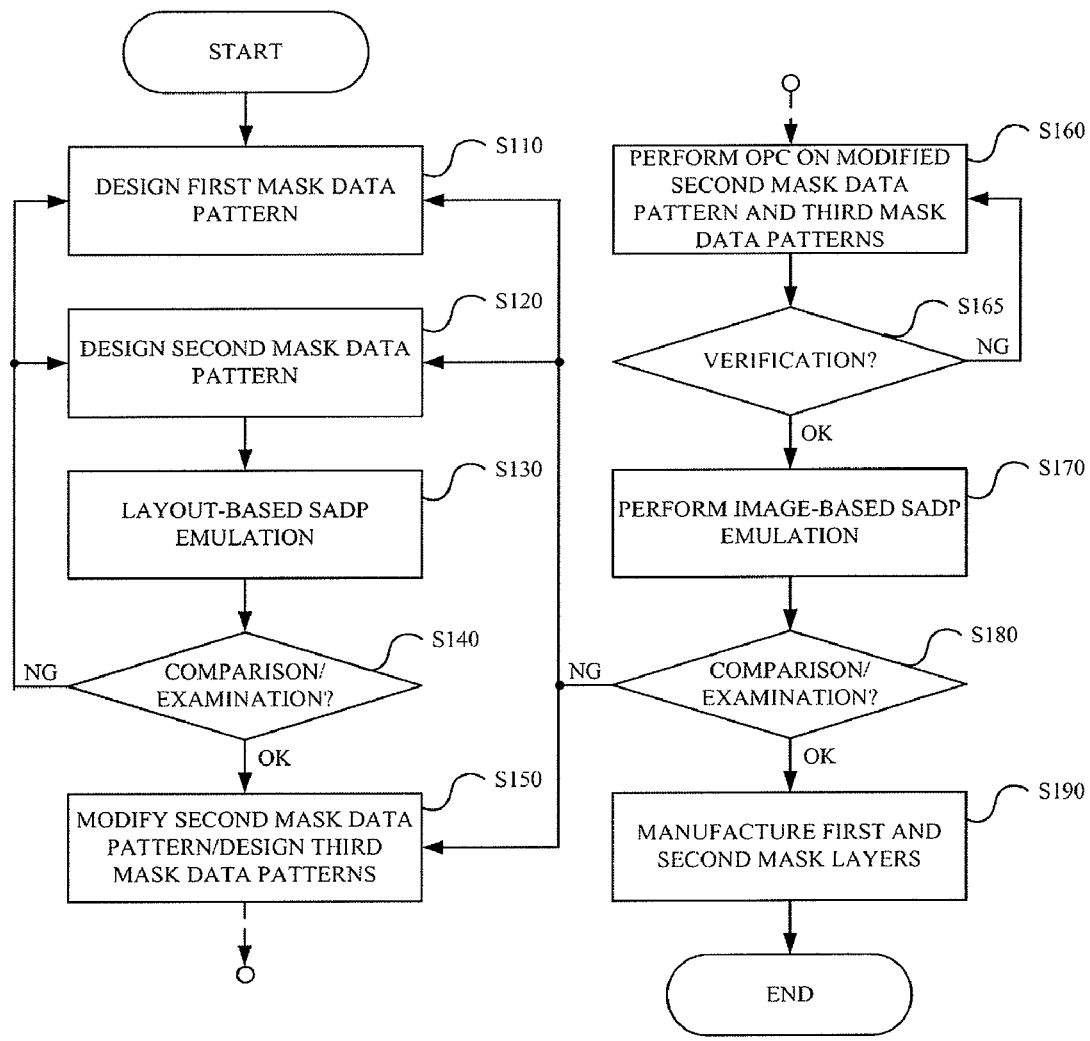
FIG. 1 is a flowchart illustrating a method of manufacturing a mask according to an exemplary embodiment of the present invention.

The advantages and characteristics of the present invention, and the method of achieving them, will be apparent with reference to exemplary embodiments described in detail later in conjunction with the accompanying drawings. However, the present invention is not limited to the exemplary embodiments disclosed below, but may be implemented in various ways. The same reference numerals are used throughout the different drawings to designate the same or similar components.

Exemplary embodiments of the present invention are described in more detail with reference to the accompanying drawings in order to describe the present invention in more detail.

FIG. 1 is a flowchart illustrating a method of manufacturing a mask according to an exemplary embodiment of the present invention, and FIGS. 2A to 2H are diagrams illustrating the method of manufacturing a mask according to the exemplary embodiment of the present invention. First to third mask data patterns illustrated in FIGS. 2A to 2H are exemplary, and the present invention is thus not limited thereto.

Figure 2A:
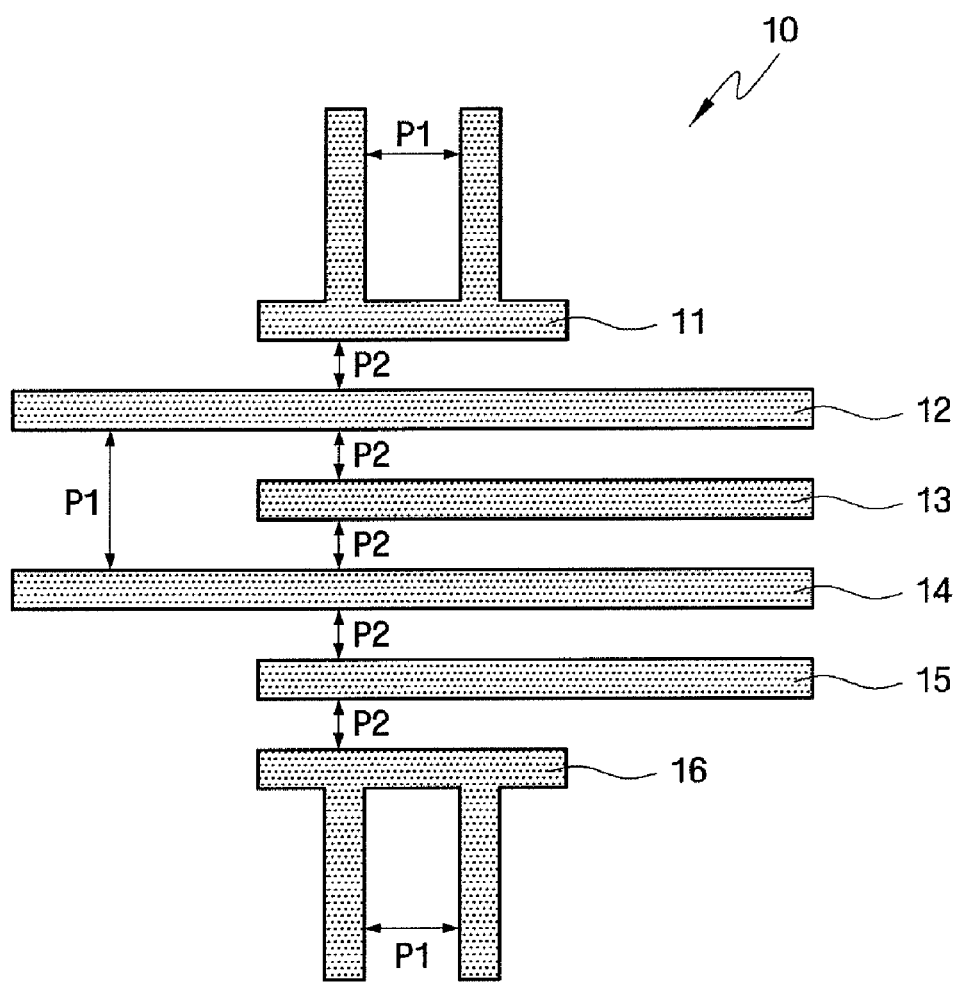

With reference to FIGS. 1 and 2A, first, a first mask data pattern 10 to be formed on a wafer is designed at step S110.

For example, the first mask data pattern 10 may include a plurality of patterns 11 to 16. The pitch between each pair of neighboring patterns among patterns 11 to 16 may be a first pitch P1 or a second pitch P2. The first pitch P1 is a value that can be achieved using typical exposure equipment, and the second pitch P2 is a value less than the minimum pitch that can be achieved using the typical exposure equipment. In this case, the pitch between two patterns (for example, those indicated by reference numerals 11 and 12) is defined as the shortest distance from the edge of a pattern (for example, reference numeral 11) to the edge of another pattern 12.

Thereafter, the partial regions of the first mask data pattern 10, which make it difficult to perform the SADP process, are checked, so that the first mask data pattern 10 can be modified.

Figure 2B:
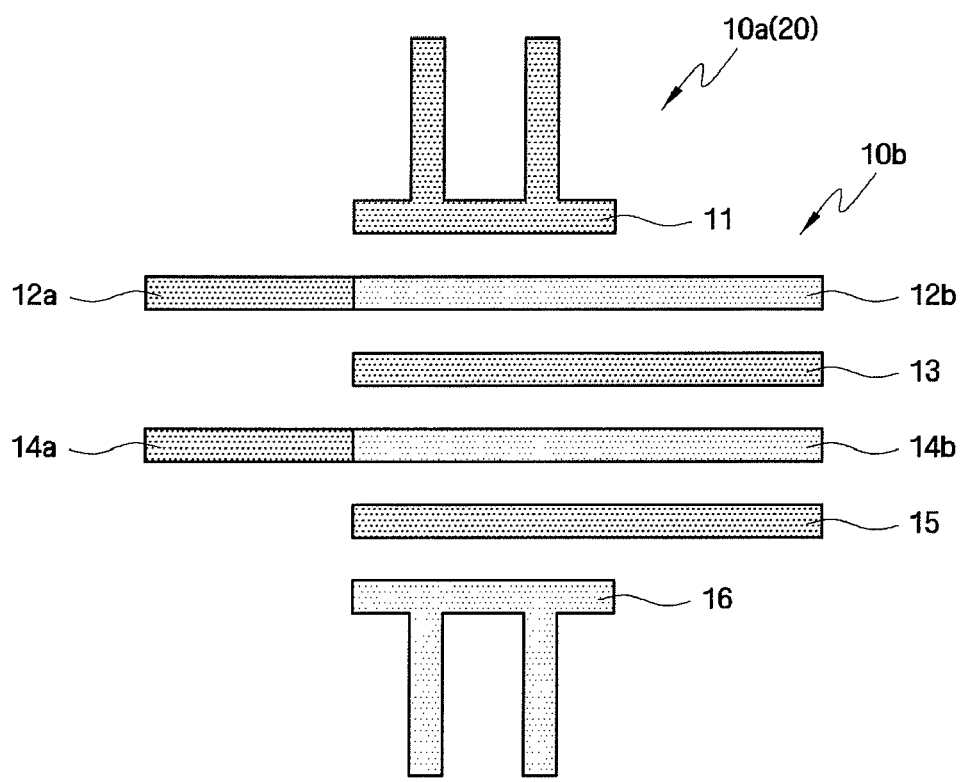

With reference to FIGS. 1 and 2B, a second mask data pattern 20 for forming the first mask data pattern 10 using the SADP process is designed at step S120.

For example, the first mask data pattern 10 is classified into a main pattern 10a (represented by a dark dot pattern) and a sub-pattern 10b (represented by a light dot pattern) depending on the main pattern 10a, according to a decomposition guide. In this case, the main pattern 10a may correspond to the second mask data pattern 20. The decomposition guide is a rule for the classification of the first mask data pattern 10 designed at an early stage to perform the SADP process. An example of the decomposition guide may include the definition "when the pitch between two neighboring patterns is less than a predetermined pitch (for example, P1), and one pattern should be necessarily classified as the main pattern 10a and another pattern should be necessarily classified as the sub-pattern 10b." As shown in FIG. 2B, when the pitch between each pair of neighboring patterns among the patterns 11 to 16 is the second pitch P2, patterns 11, 12a, 13, 14a and 15 may be classified as the main pattern 10a, and patterns 12b, 14b and 16 may be classified as the sub-pattern 10b. In an exemplary embodiment of the present invention, using the decomposition guide as a method of designing the second mask data pattern 20 is described by way of example, but the exemplary embodiments of the present invention are not limited thereto.

Figure 2C:
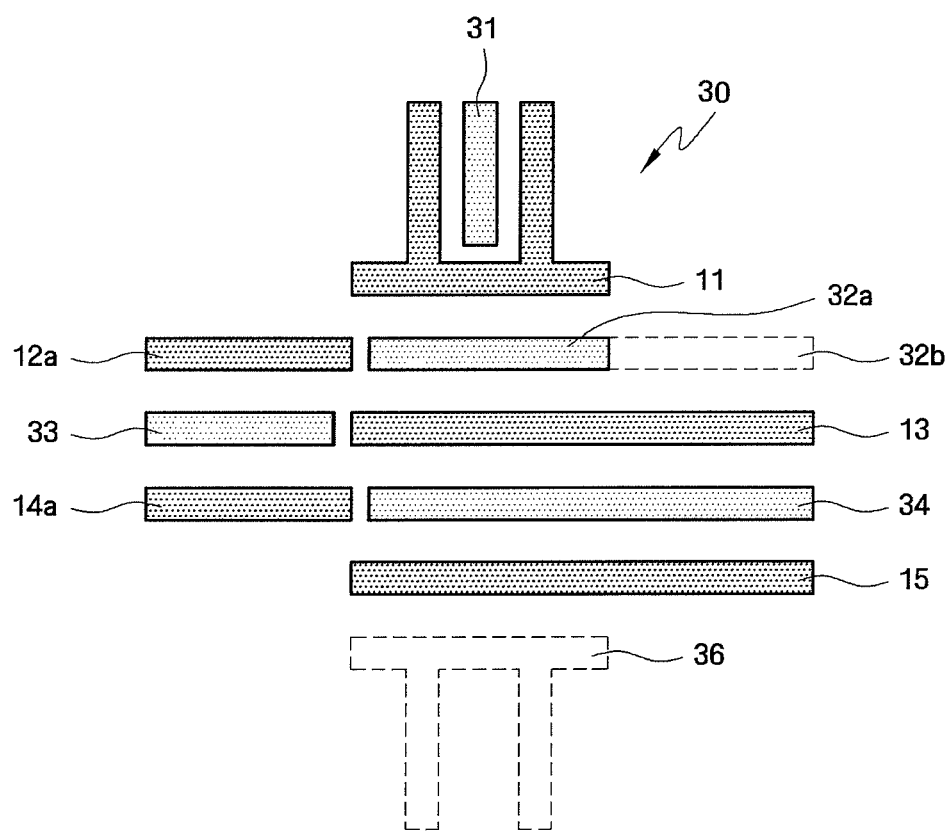

With reference to FIGS. 1 and 2C, a first emulation pattern 30 predicted from the second mask data pattern 20 is acquired using layout-based SADP emulation at step S130. The layout-based SADP emulation is one method of examining whether the first mask data pattern 10 can be normally formed from the second mask data pattern 20, but the scope of the exemplary embodiments of the present invention is not limited thereto.

Various types of layout-based SADP emulation may be used, and the method described below is by way of example only.

First, for example, a method of predicting the first emulation pattern 30, formed using the second mask data pattern 20, by inputting processing conditions, such as the pitches between patterns, the deposition thickness of a sacrificial layer (for example, a silicon oxide layer) and the deposition thickness of a hard mask layer (for example, a poly silicon layer), may be used.

Furthermore, in the case where the pitch between each pair of neighboring patterns in the second mask data pattern 20 is a value (for example, P1) less than that of a predetermined pitch when the deposition thickness of the silicon oxide layer or the deposition thickness of the polysilicon oxide layer are not input and only the pitches between the patterns are input, a method of predicting the first emulation pattern 30 through programming, which is performed so that new patterns are respectively formed between pairs of patterns, may be used.

For example, the layout-based SADP emulation does not take exposure conditions, such as wavelength, dosage and energy, into account. The reason for this is because the layout-based SADP emulation is to examine whether all of the patterns of the first mask data pattern 10 are normally formed using the second mask data pattern 20, but is not to examine the detailed shapes of the patterns formed using the second mask data pattern 20. However, when no difficulty is found upon examination of whether all of the patterns of the first mask data pattern 10 are normally formed using the second mask data pattern 20, the exposure conditions may also be taken into account by the layout-based SADP emulation.

Thereafter, the first emulation pattern 30 and the first mask data pattern 10 are compared and examined at step S140.

For example, as shown in FIG. 2C, in the first emulation pattern 30 formed using the layout-based SADP emulation, a pattern 31 is formed between the portions of the pattern 11, a pattern 33 is formed between the patterns 12a and 14a, a pattern 32a is formed between the patterns 11 and 13, and a pattern 34 is formed between the patterns 13 and 15. When the first emulation pattern 30 and the first mask data pattern 10 are compared and examined, patterns 32b and 36, which should be formed, are not yet formed, and the patterns 31 and 33, which should not be formed, are formed. Furthermore, the pattern 12a and the pattern 14a should be respectively connected with the pattern 32a and the pattern 34, but they are not yet connected.

Depending on the differences between the first emulation pattern 30 and the first mask data pattern 10, subsequent steps to be performed are changed. That is, the first mask data pattern 10 is redesigned if it is determined at an early stage that some errors exist in the design of the first mask data pattern 10 at step S110, the second mask data pattern 20 is redesigned if it is determined at an early stage that some errors exist in the design of the second mask data pattern 20 at step S120, and the partial patterns of the second mask data pattern 20 are modified, or separate third mask data patterns 40 and 50 are designed if it is determined that the differences between the first emulation pattern 30 and the first mask data pattern 10 are insignificant at step S150.

Figure 2D:
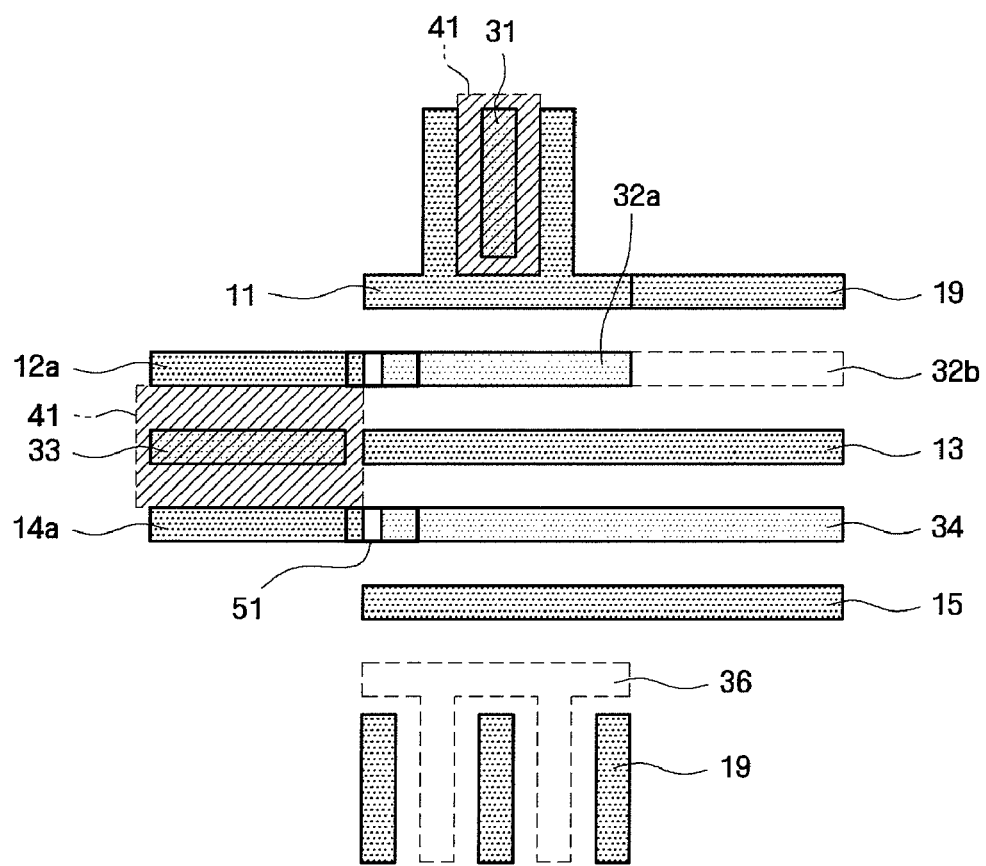

With reference to FIGS. 2D and 2E, a description of the case where the second mask data pattern 20 is modified and the separate third mask data patterns 40 and 50 are designed at step S150 is given below. For ease of description, FIG. 2D shows a modified second mask data pattern 20a and the newly designed third mask data patterns 40 and 50 overlapping each other. FIG. 2E shows the modified second mask data pattern 20a and the newly designed third mask data patterns 40 and 50 separately.

With reference to FIGS. 2D and 2E, the modification of adding the second mask data pattern 20 to dummy patterns 19 is performed to form the partial patterns 32b and 36 that were not formed in the first emulation pattern 30. In this case, the dummy patterns 19 must be added in the range in which difficulties do not occur in connection with the operation of the completed semiconductor device. Furthermore, although the dummy patterns 19, as described above, may be added to the second mask data pattern 20, it may be designed in the form of separate third mask data patterns.

To remove the patterns 31 and 33 that should not be formed in the first emulation pattern 30, a third mask data pattern 40, including trimming patterns 41, is designed.

To respectively connect the partial patterns 12a and 14a of the first emulation pattern 30 with the partial patterns 32a and 34, the third mask data pattern 50, including connection patterns 51, is designed.

Moreover, a process of acquiring a first emulation pattern, which is predicted from the modified second mask data pattern 20a and the newly designed third mask data patterns 40 and 50, using the layout-based SADP emulation, and remodifying the modified second mask data pattern 20a or modifying the newly designed third mask data patterns 40 and 50 may be repeated.

Figure 2F:
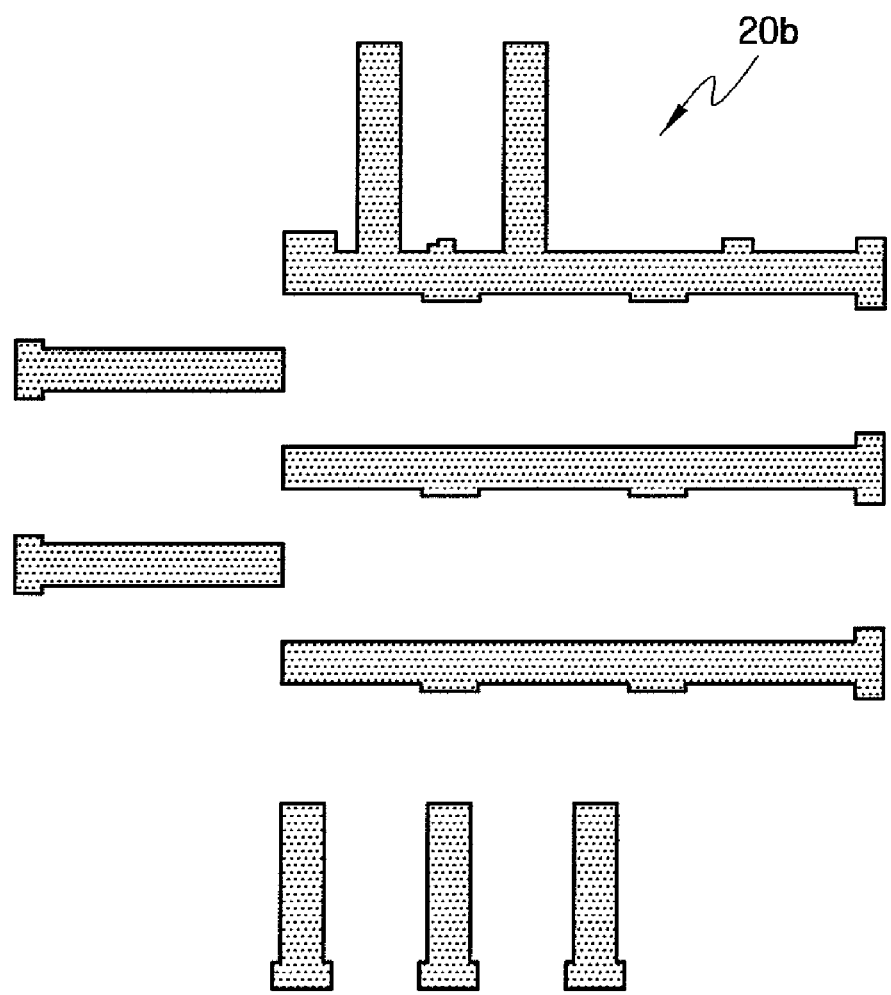

With reference to FIGS. 1 and 2F, Optical Proximity Correction (OPC) is performed on the modified second mask data pattern 20a and the third mask data patterns 40 and 50 at step S160. For ease of description, only second mask data pattern 20b, which is formed by performing the OPC on the modified second mask data pattern 20a, is shown in FIG. 2F.

Various types of methods of performing OPC may be used, and the OPC method is described below by way of example only.

A rule table-based correction method is a method of listing the amounts of correction depending on the arrangements of patterns in a rule table, and correcting the patterns of the mask data pattern with reference to the rule table. Although the correction method has a simple correction sequence, it may be difficult to list the entire range of variation in an actual mask data pattern in the table.

A model-based correction method is a method of correcting a mask data pattern so as to predict the shape that will be transferred onto a wafer based on pattern and wafer process conditions, and realize a desired pattern on the wafer. That is, evaluation marks are made on the edge of a mask data pattern to perform the OPC, and the edge is divided according to the evaluation marks. Furthermore, the intensity of light around the evaluation marks is calculated and the divided edge is moved, so that the mask data pattern is modified.

Thereafter, the second mask data pattern 20b, on which the OPC has been performed, is verified, and the OPC is repeated until there is no pattern to be corrected at step S165.

Figure 2G:
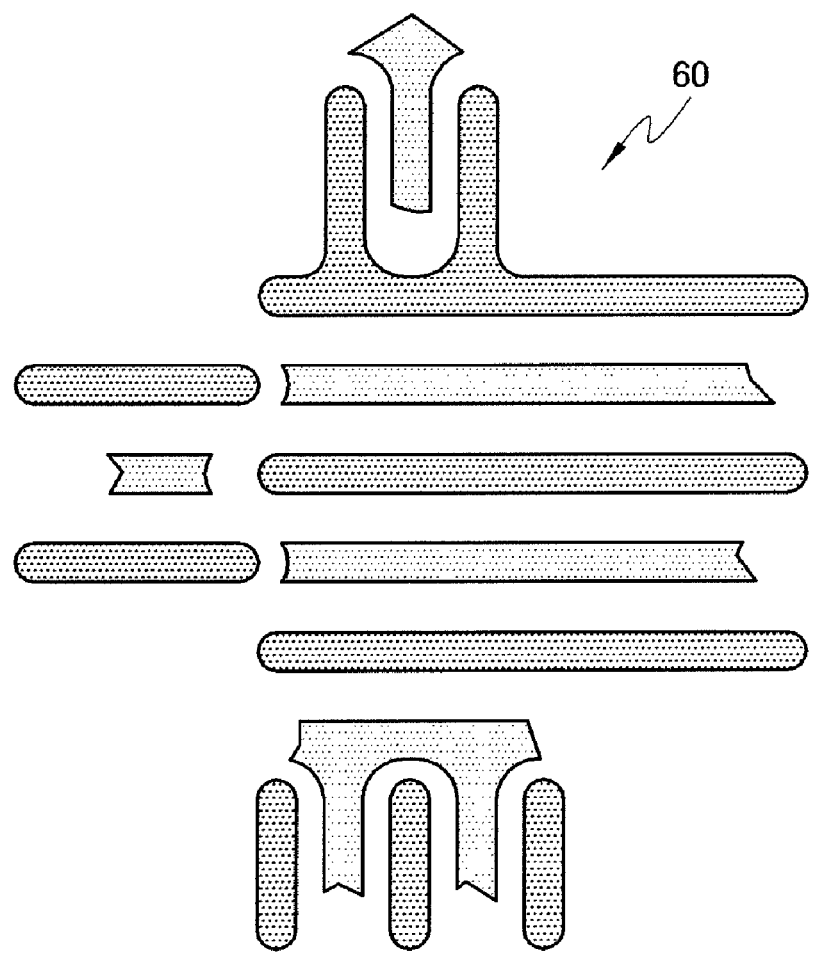
Figure 2H:
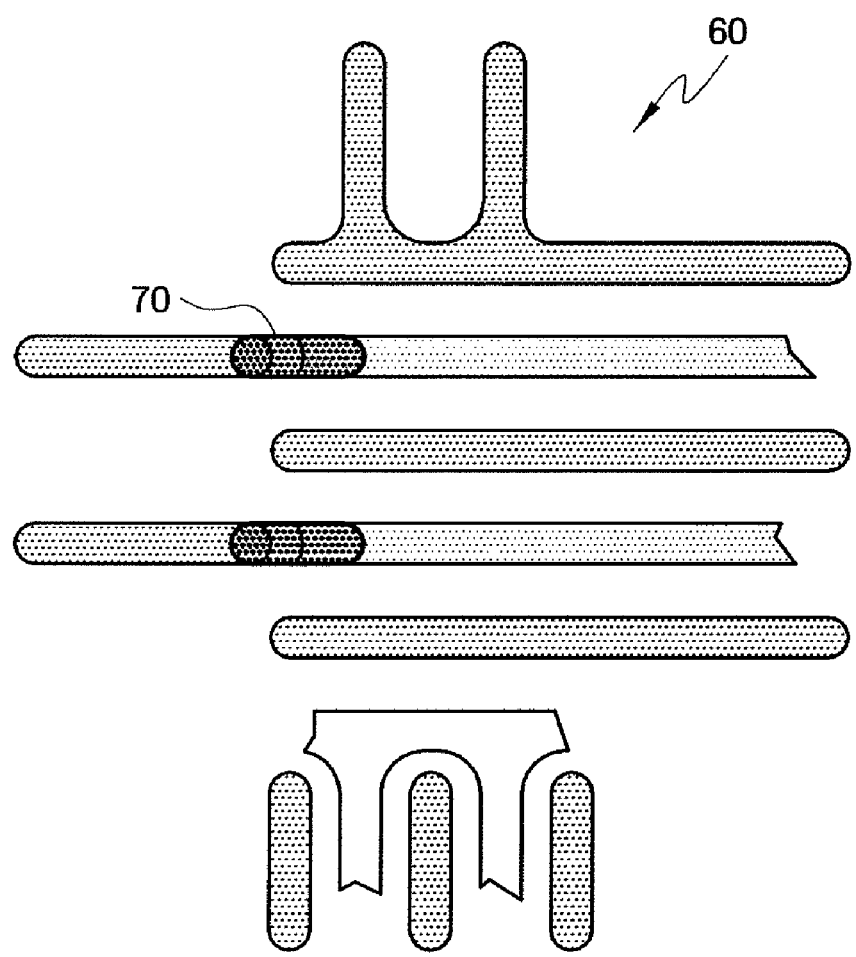

With reference FIGS. 1, 2G and 2H, the second mask data pattern 20b, on which the OPC has been performed, and second emulation patterns 60 and 70 predicted from third mask data patterns, are acquired using the image-based SADP emulation at step S170. For ease of description, FIG. 2G shows only the second emulation pattern 60, which is formed using the second mask data pattern 20b on which OPC is performed, and FIG. 2F shows the overlapped second emulation patterns 60 and 70, which are formed using the third mask data patterns on which the OPC has been performed.

For example, in the image-based SADP emulation, a method of predicting the second emulation patterns 60 and 70, formed using the second mask data pattern 20b, and the third mask data patterns, which are corrected by inputting exposure conditions, such as the wavelength of light, dosage, and energy, as well as process conditions, such as pitches between patterns, the deposition thickness of a silicon oxide layer and the deposition thickness of a polysilicon oxide layer, may be used. The image-based SADP emulation takes exposure conditions, other than the process conditions, into account, so that the actual pattern formed on the wafer can be formed using the second mask data pattern 20b and the third mask data patterns, on which OPC is performed.

With reference to FIG. 1, the second emulation patterns 60 and 70 and the first mask data pattern 10 are compared and examined at step S180.

For example, according to the differences between the second emulation patterns 60 and 70 and the first mask data pattern 10, subsequent steps to be performed are changed. That is, the first mask data pattern 10 is redesigned if it is determined at an early stage that some errors exist in the design of the first mask data pattern 10 at step S110. The second mask data pattern 20 is redesigned if it is determined at an early stage that some errors exist in the design of the second mask data pattern 20 at step S120, and the partial patterns of the second mask data pattern 20 are modified, or separate third mask data patterns 40 and 50 are designed if it is determined that the differences between the first emulation pattern 30 and the first mask data pattern 10 are insignificant at step S150.

Thereafter, if, as a result of the image-based SADP emulation, it is determined that the second mask data pattern 20b and the third mask data patterns, on which the OPC has been performed, has been normally manufactured, the first and second mask layers, which respectively correspond to the second mask data pattern 20b and the third mask data patterns, on which the OPC has been performed, are manufactured at step S190.

Figure 3:
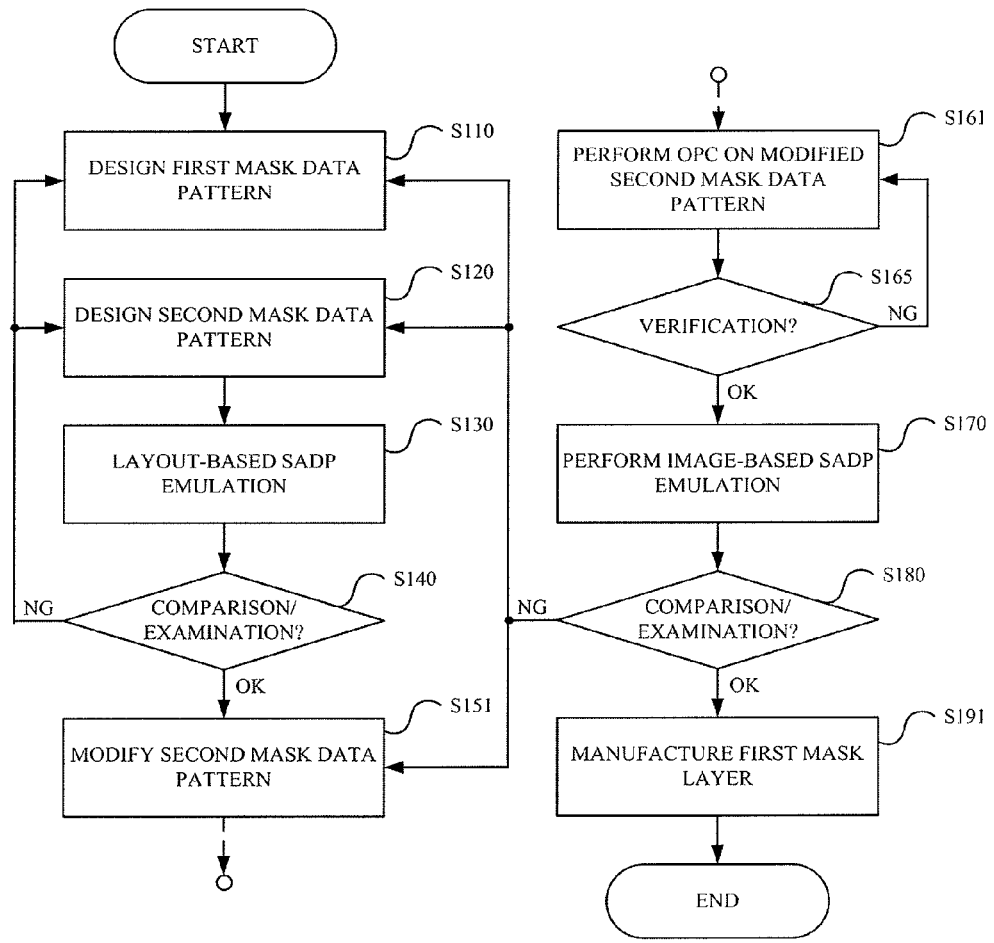
FIG. 3 is a flowchart illustrating a method of manufacturing a mask according to an exemplary embodiment of the present invention.

FIG. 3 is a flowchart illustrating a method of manufacturing a mask according to another exemplary embodiment of the present invention.

With reference to FIG. 3, the method of manufacturing a mask according to the second exemplary embodiment of the present invention differs from the first exemplary embodiment in that, after the comparison and examination of the first emulation pattern and the first mask data pattern, the separate third mask data patterns are not redesigned but only the second mask data pattern is modified at step S151. Accordingly, OPC is performed on only the modified second mask data pattern at step 161 and then a first mask layer, which corresponds to the second mask data pattern, on which the OPC has been performed, is manufactured at step S191.

Figure 4:
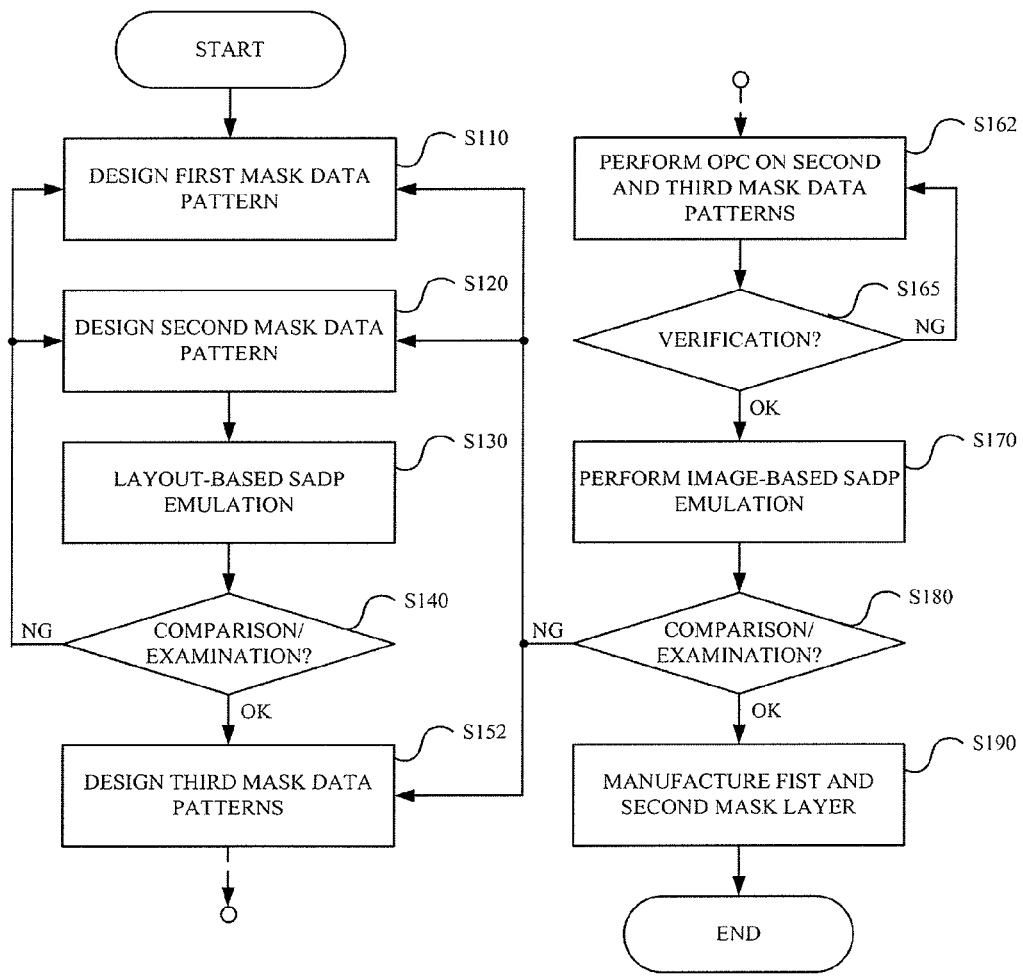
FIG. 4 is a flowchart illustrating a method of manufacturing a mask according to an exemplary embodiment of the present invention.

FIG. 4 is a flowchart illustrating a method of manufacturing a mask according to an exemplary embodiment of the present invention.

With reference to FIG. 4, the method of manufacturing a mask according to the third exemplary embodiment of the present invention differs from the first exemplary embodiment in that after the comparison and examination of the first emulation pattern and the first mask data pattern, the second mask data patterns are not modified but only the separate third mask data patterns are newly designed at step S152. Accordingly, OPC is performed on the second and third mask data patterns at step S162.

With reference to FIGS. 5A to 5I, an SADP process, which is performed using first to second mask layers, which are manufactured using the method of manufacturing of a mask according to the first exemplary embodiment of the present invention, is described by way of example below.

Figure 5A:
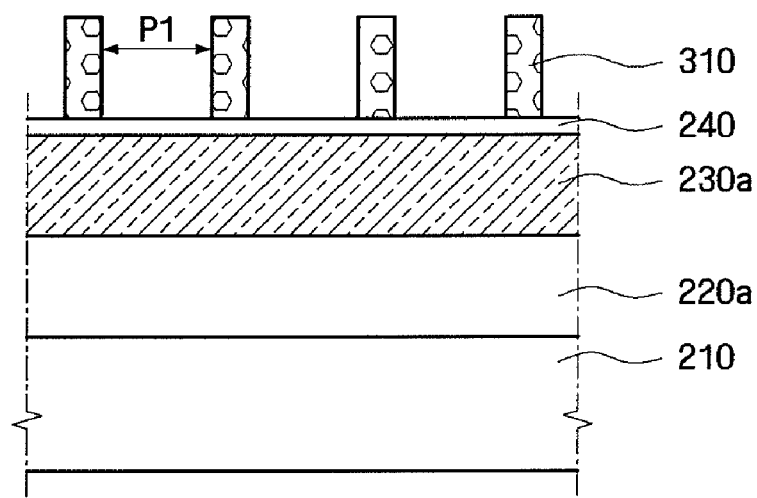
FIG. 5A to 5I are diagrams illustrating an example of an SADP process that is performed using first and second mask layers manufactured using a method of manufacturing a mask according to an exemplary embodiment of the present invention.

With reference to FIG. 5A, an etching target layer 220a, a first hard mask layer 230a, an anti-reflective film 240, and a first photoresist film pattern 310 are sequentially layered on a substrate 210. The etching target layer 220a is a layer that must be etched, and may be a conductive layer for forming gate electrodes, bitlines, capacitor storage nodes or the like, or may be an insulation layer, such as an oxide layer or a nitride layer, in which contact holes are formed. The first hard mask layer 230a is formed of a layer having a high etching selectivity for the etching target layer 220a. In the case where the etching target layer 220a is an insulation layer, the first hard mask layer 230a may be a polysilicon oxide layer. In this case, the first photoresist film pattern 310 is formed using the first mask layer, which corresponds to the corrected second mask data pattern 20b. Accordingly, the values of pitches between the patterns of the first photoresist film pattern 310 may be equal to the first pitch P1.

Figure 5B:
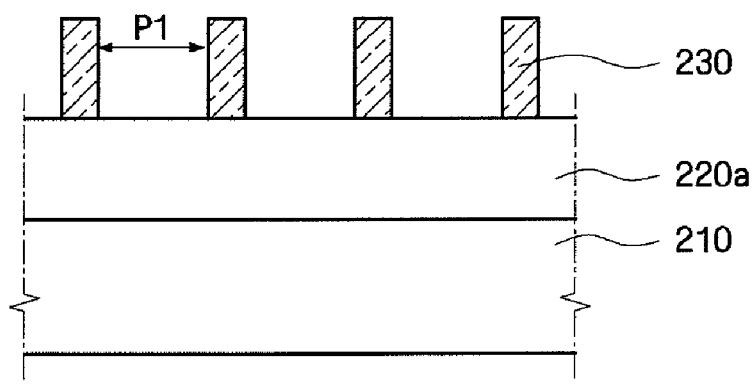

With reference to FIG. 5B, a first hard mask layer 230a exposed by the first photoresist film pattern 310 is patterned and, thus, a first hard mask layer pattern 230 having the first pitch P1 is formed. Thereafter, the first photoresist film pattern 310 is removed through an ashing/strip process.

Figure 5C:
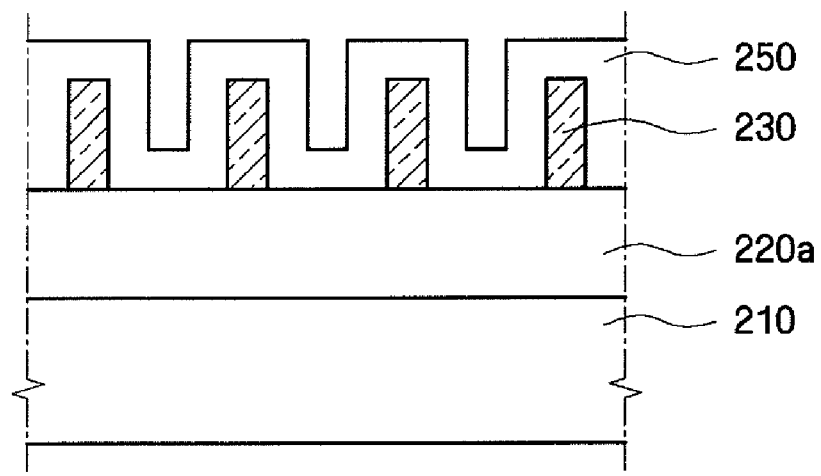

With reference to FIG. 5C, a sacrificial layer 250 is formed on the first hard mask layer pattern 230 and the exposed substrate 210 to a predetermined thickness. The sacrificial layer 250 has improved step coverage so as to be conformally layered along the first hard mask layer pattern 230 and the exposed substrate 210, and may be made of a material having a high etching selectivity for the first hard mask layer pattern 230. For example, a silicon oxide layer may be used as the sacrificial layer 250. Examples of the silicon oxide layer may include a Middle Temperature Oxide (MTO) layer, Undoped Silica Glass (USG), an $O_3$-Tetra Ethyl Ortho Silicate ($O_3$-TEOS) layer, and a High Density Plasma (HDP) layer. For example, the silicon oxide layer may be formed using a thermal oxidation process, a Chemical Vapor Deposition (CVD) process, or the like. In this case, the sacrificial layer 250 may be formed so as to have a thickness corresponding to ⅓ of the first pitch P1.

Figure 5D:
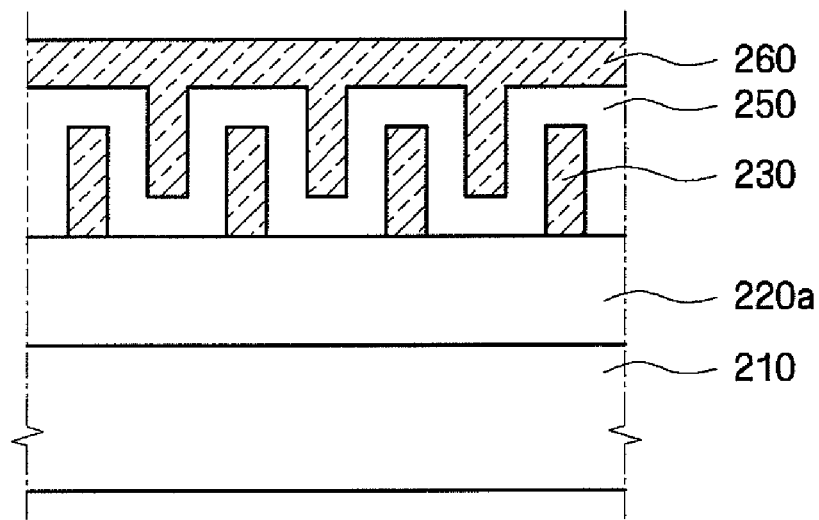

With reference to FIG. 5D, a second hard mask layer 260 is formed on the sacrificial layer 250. The second hard mask layer 260 is formed of a layer having a high etching selectivity for the sacrificial layer 250, and may be made of the same material as the first hard mask layer pattern 230.

Figure 5E:
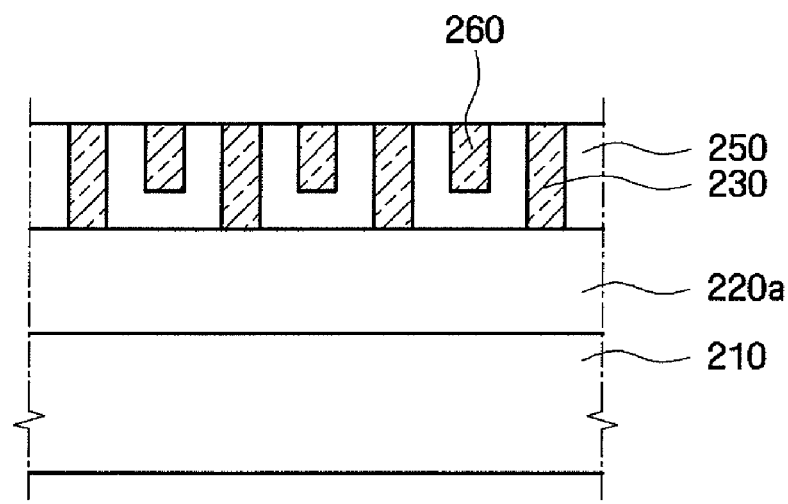

With reference to FIG. 5E, the second hard mask layer 260 and the sacrificial layer 250 are partially planarized to expose the upper surface of the first hard mask layer pattern 230. The planarization process may be performed, for example, using a Chemical Mechanical Polishing (CMP) process or an etch-back process.

Figure 5F:
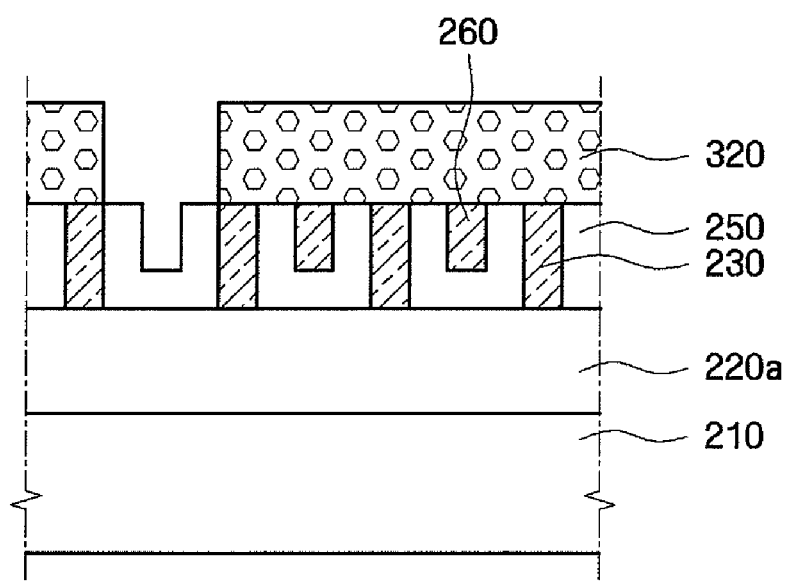

With reference to FIG. 5F, a second photoresist film pattern 320 is formed on the resultant product, and the second hard mask layer pattern 260 exposed by the second photoresist film pattern 320 is removed using wet etching. In this case, the second photoresist film pattern 320 is formed using the second mask layer, which corresponds to the third mask data pattern, on which the OPC has been performed, including trimming patterns. Thereafter, the second photoresist film pattern 320 is removed through an ashing/strip process.

Figure 5G:
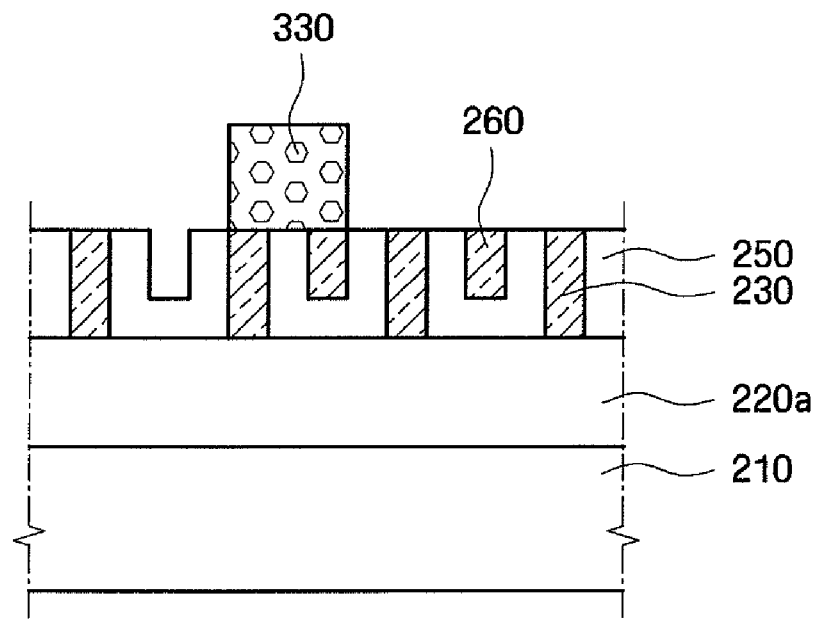

With reference to FIG. 5G, a third photoresist film pattern 330 is formed on the resultant product. In this case, the third photoresist film pattern 330 may be formed using the second mask layer, which corresponds to the third mask data pattern, on which the OPC has been performed, including connection patterns.

Figure 5H:
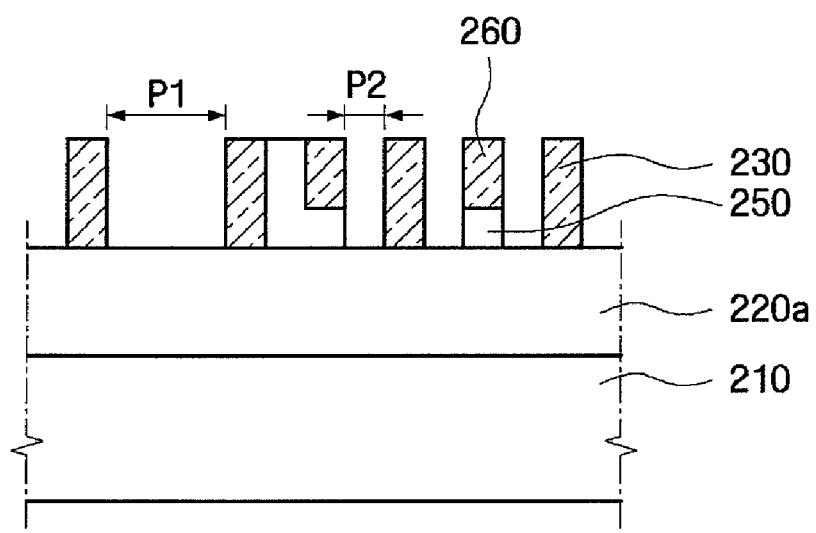

With reference to FIG. 5H, the sacrificial layer 250 exposed by the third photoresist film pattern 330 is removed using, for example, anisotropic etching, a dry etching process or a reactive ion etching process. Accordingly, the hard mask layer, which has undergone anisotropic etching, has the first pitch P1, and the second pitch P2 less than the first pitch P1.

Figure 5I:
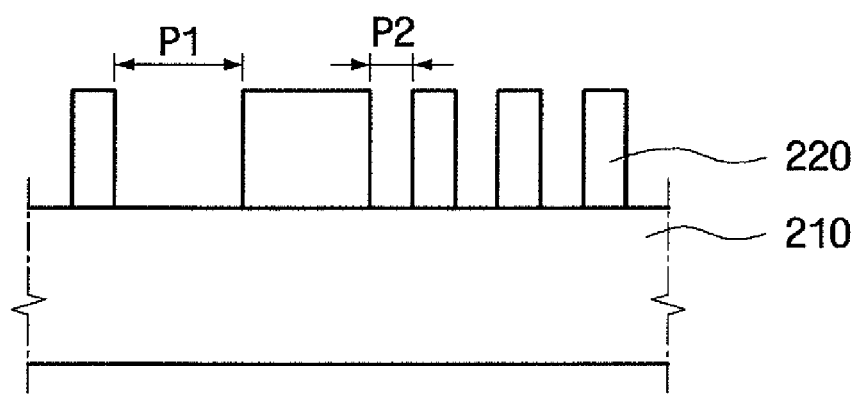

With reference to FIG. 5I, the etching target layer 220a exposed by the hard mask layer is etched using, for example, anisotropic etching and, thus, the etching target layer pattern 220 is completed. In this case, the etching target layer pattern 220 has the first pitch P1, and the second pitch P2 less than the first pitch P1.

As described above, with the method of manufacturing a mask according to exemplary embodiments of the present invention, a mask data pattern for performing an SADP process having high reliability can be formed using the layout-based SADP emulation and the image-based SADP emulation.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of manufacturing a mask, the method comprising:
   designing a first mask data pattern;
   designing a second mask data pattern for forming the first mask data pattern;
   acquiring a first emulation pattern, which is predicted from the second mask data pattern, using layout-based Self-Aligning Double Patterning (SADP) emulation;
   comparing the first emulation pattern with the first mask data pattern, and modifying the second mask data pattern according to results of the comparison;
   performing Optical Proximity Correction (OPC) on the modified second mask data pattern;
   acquiring second emulation patterns, which are predicted from the second mask data pattern on which the OPC has been performed, using image-based SADP emulation; and
   comparing the second emulation patterns and the first mask data pattern, and
   manufacturing a first mask layer, which corresponds to the second mask data pattern on which the OPC has been performed, according to results of the comparison.

2. The method of claim 1, wherein the layout-based SADP emulation takes exposure conditions into account, and the image-based SADP emulation does not take the exposure conditions into account.

3. The method of claim 1, wherein:
   the modifying of the second mask data pattern comprises modifying the second mask data pattern, and designing third mask data patterns for forming some patterns that were not formed using the second mask data pattern;
   the performing of the OPC on the modified second mask data pattern comprises performing OPC on the modified second data pattern and the third mask data pattern;
   the acquiring of the second emulation pattern predicted from the corrected second mask data pattern comprises acquiring second emulation patterns predicted from the second and the third mask data patterns, on which the OPC has been performed; and
   the manufacturing of the first mask layer comprises manufacturing first and second mask layers, which respectively correspond to the second and the third mask data patterns on which the OPC has been performed.

4. The method of claim 3, wherein the third mask data patterns comprise trimming patterns for trimming partial patterns of the first emulation pattern.

5. The method of claim 3, wherein the third mask data patterns comprise connection patterns for connecting partial patterns of the first emulation pattern with other partial patterns of the first emulation pattern.

6. The method of claim 3, wherein the third mask data patterns comprise dummy patterns, which are used to generate partial patterns in the first emulation pattern.

7. The method of claim 1, further comprising comparing the first emulation pattern with the first mask data pattern and redesigning the first or second mask data pattern according to results of the comparison.

8. The method of claim 1, further comprising comparing the second emulation patterns with the first mask data pattern and redesigning the first or second mask data pattern according to results of the comparison.

9. A method of manufacturing a mask, the method comprising:
designing a first mask data pattern;
designing a second mask data pattern for forming the first mask data pattern;
acquiring a first emulation pattern, which is predicted from the second mask data pattern, using layout-based Self-Aligning Double Patterning (SADP) emulation;
comparing the first emulation pattern with the first mask data pattern, and designing third mask data patterns for forming partial patterns, which were not formed using the second mask data pattern, according to results of the comparison;
performing Optical Proximity Correction (OPC) on the second and the third mask data patterns;
acquiring second emulation patterns, which are predicted from the second and the third mask data patterns on which the OPC has been performed, using image based SADP emulation; and
comparing the second emulation patterns with the first mask data pattern, and manufacturing first and second mask layers, which respectively correspond to the second and the third mask data patterns on which the OPC has been performed, according to results of the comparison.

10. The method of claim 9, wherein the layout-based SADP emulation takes exposure conditions into account, and the image-based SADP emulation does not take the exposure conditions into account.

11. The method of claim 9, wherein the third mask data patterns comprise trimming patterns for trimming partial patterns of the first emulation pattern.

12. The method of claim 9, wherein the third mask data patterns comprise connection patterns for connecting partial patterns of the first emulation pattern with other partial patterns of the first emulation pattern.

13. The method of claim 9, wherein the third mask data patterns comprise dummy patterns, which are used to generate partial patterns in the first emulation pattern.

14. The method of claim 9, wherein:
the designing of the third mask data patterns comprises modifying the second mask data pattern, and designing the third mask data patterns; and
the performing of the OPC on the second and the third mask data patterns comprises performing OPC on the modified second mask data pattern and the third mask data pattern.

15. The method of claim 9, further comprising comparing the first emulation pattern with the first mask data pattern, and redesigning the first or the second mask data pattern according to results of the comparison.

16. The method of claim 9, further comprising comparing the second emulation patterns with the first mask data pattern and redesigning at least one of the first to third mask data patterns according to results of the comparison.

17. A method of manufacturing a mask, the method comprising:
designing a first mask data pattern to be formed on a wafer;
designing a second mask data pattern for forming the first mask data pattern using a Self-Aligning Double Patterning (SADP) process;
examining whether the first mask data pattern is normally formed using the second mask data pattern, wherein the examination is performed using layout-based SADP emulation; and
forming third mask data patterns for forming partial patterns, which were not formed using the second mask data pattern, according to results of the examination.

18. The method of claim 17, further comprising:
performing Optical Proximity Correction (OPC) on the second and the third mask data patterns; and
examining whether the first mask data pattern is normally formed using the second and the third mask data patterns, on which the OPC has been performed.

19. The method of claim 18, wherein the examining whether the first mask data pattern is normally formed using the second and the third mask data patterns is performed using image-based SADP emulation.

20. The method of claim 18, further comprising manufacturing first and second mask layers, which respectively correspond to the second and the third mask data patterns, according to results of the examining whether the first mask data pattern is normally formed using the second and the third mask data patterns.

* * * * *